United States Patent
Furukawa et al.

(10) Patent No.: US 9,714,968 B2
(45) Date of Patent: Jul. 25, 2017

(54) SURFACE POTENTIAL DISTRIBUTION MEASURING DEVICE

(71) Applicants: TOSHIBA MITSUBISHI-ELECTRIC INDUSTRIAL SYSTEMS CORPORATION, Chuo-ku (JP); THE UNIVERSITY OF TOKYO, Bunkyo-ku (JP)

(72) Inventors: Masaaki Furukawa, Tokyo (JP); Yuichi Tsuboi, Tokyo (JP); Tetsuo Yoshimitsu, Tokyo (JP); Akiko Kumada, Tokyo (JP); Kunihiko Hidaka, Tokyo (JP); Hisatoshi Ikeda, Tokyo (JP)

(73) Assignees: TOSHIBA MITSUBISHI-ELECTRIC INDUSTRIAL SYSTEMS CORPORATION, Chuo-ku (JP); THE UNIVERSITY OF TOKYO, Bunkyo-ku (JP)

( * ) Notice: Subject to any disclaimer, the term of this patent is extended or adjusted under 35 U.S.C. 154(b) by 150 days.

(21) Appl. No.: 14/775,443

(22) PCT Filed: Mar. 19, 2013

(86) PCT No.: PCT/JP2013/001872
§ 371 (c)(1),
(2) Date: Sep. 11, 2015

(87) PCT Pub. No.: WO2014/147660
PCT Pub. Date: Sep. 25, 2014

(65) Prior Publication Data
US 2016/0041215 A1  Feb. 11, 2016

(51) Int. Cl.
*G01R 29/14* (2006.01)
*G01R 31/34* (2006.01)
(Continued)

(52) U.S. Cl.
CPC ........... *G01R 29/14* (2013.01); *G01R 15/242* (2013.01); *G01R 31/1227* (2013.01); *G01R 31/34* (2013.01); *G01R 31/346* (2013.01)

(58) Field of Classification Search
CPC ............ G01R 29/14; G01R 29/12; G02F 1/03
See application file for complete search history.

(56) References Cited

U.S. PATENT DOCUMENTS 5,055,770 A   10/1991  Takahashi et al.
5,128,950 A   7/1992   Tsuchiya et al.
(Continued)

FOREIGN PATENT DOCUMENTS

JP   03-156379 A   7/1991
JP   05-196672 A   8/1993
(Continued)

OTHER PUBLICATIONS

Office Action issued on Jan. 31,2017 in Japanese Patent Application No. 2015-506358 with unedited computer generated English translation.

(Continued)

*Primary Examiner* — Son Le
*Assistant Examiner* — Alvaro Fortich
(74) *Attorney, Agent, or Firm* — Oblon, McClelland, Maier & Neustadt, L.L.P.

(57) ABSTRACT

A surface-potential distribution measuring device includes: a laser light source; a Pockels crystal; a mirror; a photodetector that detects light intensity of the laser beam reflected by the mirror; a holding and mounting part that holds and moves the Pockels crystal; a voltage correction database; and a calculation unit that identifies an input voltage corresponding to a testing output voltage as a surface potential of the electric-field-reduction system. The Pockels crystal is formed in such a way that a size of a cross section of the (Continued)

Pockels crystal that is perpendicular to an axial direction changes along the axial direction. The holding and mounting part has a protection unit to protect a structure of the Pockels crystal, a movement unit to that moves the Pockels crystal in order to measure a surface potential of the electric-field-reduction system, and a drive control unit to control the movement unit.

11 Claims, 8 Drawing Sheets

(51) Int. Cl.
    *G01R 15/24*     (2006.01)
    *G01R 31/12*     (2006.01)

(56) References Cited

U.S. PATENT DOCUMENTS

| | | | |
|---|---|---|---|
| 5,179,565 A | 1/1993 | Tsuchiya et al. | |
| 2004/0095570 A1 | 5/2004 | Stanimirov et al. | |
| 2006/0187521 A1* | 8/2006 | Balle | G02F 1/0322 359/257 |
| 2007/0236771 A1* | 10/2007 | Zadoyan | H01S 3/127 359/257 |
| 2014/0300368 A1* | 10/2014 | Tsuboi | G01R 29/14 324/457 |

FOREIGN PATENT DOCUMENTS

| | | |
|---|---|---|
| JP | 05-307057 A | 11/1993 |
| JP | 07-181211 A | 7/1995 |
| JP | 08-122381 A | 5/1996 |
| JP | 10-038952 A | 2/1998 |
| JP | 11-133118 A | 5/1999 |
| JP | 2004-525361 A | 8/2004 |
| JP | 2011-022007 A | 2/2011 |

OTHER PUBLICATIONS

Kumada Akiko, et al. The Direct Potential Distribution Measurement of Propagating Surface Discharge by Using Pockels Effect, Journal of the Institute of Electrical Engineers of Japan, vol. 118, No. 6, Jun. 1998, pp. 723-728 with English Abstract.

Hirokazu Matsumoto, et al. "Oscillatory Waveform Caused by Piezoelectric Vibration of Pockels Crystal and its Effective Suppression", IEEJ Transactions on Electrical and Electronic Engineering, 2011; vol. 6, pp. 1-6.

International Search Report issued on Jun. 25, 2013 for PCT/JP2013/001872.

Extended European Search Report issued on Oct. 21, 2016 in European Patent Application No. 13878691.8.

* cited by examiner

SURFACE POTENTIAL DISTRIBUTION MEASURING DEVICE

TECHNICAL FIELD

The present invention relates to a surface potential distribution measuring device to measure a surface potential distribution of an electric field reduction system of a rotating electrical machine.

BACKGROUND ART

An inverter-driven rotating electric machine system that uses an inverter to drive a rotating electric machine has been developed and widely used. In the inverter-driven rotating electric machine system, the inverter performs a switching operation to convert DC voltage to pulse voltage, and supplies the pulse voltage to the rotating electric machine via a cable. The rotating electric machine is driven by the pulse voltage.

In a conventional high-voltage rotating electric machine, particularly in order to prevent partial discharge that could occur near an end of a core of a stator coil and generation of heat, an electric-field-reduction system is provided in many cases on a surface of the coil near the end of the core of the stator. The electric-field-reduction system is a combination of a low resistance layer, which is led out of a stator core slot, and an electric field reduction layer, which is formed in such a way as to partially overlap with the low resistance layer.

Meanwhile, in the inverter-driven rotating electric machine system, reflected waves are generated due to an impedance mismatch between the inverter, cable, and rotating electric machine. The reflected waves are superimposed on the pulse voltage. As a result, in a unit between the cable and the rotating electric machine, or particularly in a unit where the cable and the rotating electric machine are connected, high voltage noise, or so-called inverter surge, could occur.

If the pulse voltage including the inverter surge (which will be referred to as inverter pulse voltage) occurs repeatedly, the partial discharge that occurs during operation at a commercial frequency and the generation of heat become even larger at the above-described core-end stator coils (which will be referred to as stator coil ends). Even on the electric-field-reduction system, partial discharge and heat are generated to such a degree that the reliability is hampered. Finally, the reliability of the stator coils could be significantly reduced.

The partial discharge and the generation of heat are dependent on the surface potential of the electric-field-reduction system (Refer to Non-Patent Document 1). Accordingly, there is an increasing need for a technique for accurately measuring the surface potential of the electric-field-reduction system in the case that the inverter pulse voltage would occur.

PRIOR ART DOCUMENTS

Patent Documents

Patent Document 1: Japanese Patent Application Laid-Open Publication No. 2011-22007

Non-Patent Documents

Non-Patent Document 1: Akiko Kumada, Masakuni Chiba, and Kunihiro Hidaka "The Direct Potential Distribution Measurement of Propagating Surface Discharge by Using Pockels Effect", the transactions of the Institute of Electrical Engineers of Japan A, Vol. 118-A, No. 6, pp. 723-728 (1998-6).

Non-Patent Document 2: Hirokazu Matsumoto, Shigeyasu Matsuoka, Akiko Kumada, Kunihiko Hidaka, "Oscillatory Waveform Caused by Piezoelectric Vibration of Pockels Crystal and its Effective Suppression", IEEJ TRANSACTIONS ON ELECTRICAL AND ELECTRONIC ENGINEERING, 6: 1-6 (2011)

SUMMARY OF THE INVENTION

Problems to be Solved by the Invention

To measure the surface potential, a surface electrometer is usually used. For example, according to the technique disclosed in Patent Document 1, a probe is placed on the electric-field-reduction system or is moved closer to the electric-field-reduction system, and the surface potential is measured by the surface electrometer to be used to calculate nonlinear resistance.

However, the inverter pulse voltage includes high frequency components of kHz-order or more. In this case, the surface electrometer cannot follow the above-mentioned high frequency components, and cannot measure the surface potential of the electric-field-reduction system in which the inverter pulse voltage is supposed to occur.

The probe is usually made of metallic material. Therefore, according to the method of placing the probe on the electric-field-reduction system or moving the probe closer to the electric-field-reduction system, static electricity might be generated between the electric-field-reduction system and the probe. Moreover, in such cases as where the inverter surge has occurred, corona discharge might occur between the electric-field-reduction system and the probe. In this manner, when the metallic material is used at a measurement point, it is impossible to measure the surface potential of the electric-field-reduction system in which the inverter pulse voltage is supposed to occur, due to a disturbance in a measurement target.

Accordingly, the technique has been developed to measure the surface potential of the electric-field-reduction system by using a Pockels crystal to measure a change in light intensity caused by a change in the refractive index, which changes according to the surface potential of the electric-field-reduction system (Non-Patent Document 1).

Meanwhile if voltage of a specific frequency is applied to the Pockels crystal, an out-of-plane vibration occurs on a side surface of a longitudinal direction of the Pockels crystal. The problem is that the vibration causes vibration components to be superimposed on output light intensity.

As a result of research on the vibration, it was found that the vibration is dependent on the shape and size of the Pockels crystal. As a result of experiments and analysis conducted so far on this problem, it was found that the vibration can be curbed by tapering the shape of the Pockels crystal in the longitudinal direction (Non-Patent Document 2).

However, the tip of the Pockels crystal becomes thinner as a result of the tapering of the Pockels crystal, resulting in a decrease in the structural strength. Therefore, if the tapered Pockels crystal is used to measure the surface potential of the electric-field-reduction system, the problem arises that the measurement function could be lost as a result of the crystal being damaged or broken, or that the expensive crystal may need to be made again.

The object of the present invention is to measure the surface potential of the electric-field-reduction system in which the inverter pulse voltage is supposed to occur, without damaging the soundness of the tapered Pockels crystal.

Means for Solving the Problem

According to the present invention, there is provided a surface-potential distribution measuring device for measuring a surface potential of an electric-field-reduction system that is applied along a longitudinal direction of a stator coil end which is a stator coil end unit of a stator of a rotating electric machine, the device comprising: a laser light source to emit a laser beam; a Pockels crystal to receive the laser beam emitted from the laser light source via a first end surface of the Pockels crystal in an incident direction; a mirror whose surface is provided at a second end surface that is the opposite side of the Pockels crystal from the first end surface and which reflects the laser beam that enters the Pockels crystal via the first end surface in a direction opposite to the incident direction; a photodetector having a band to follow a high frequency component of an inverter pulse voltage, a photodetector to receive the laser beam reflected by the mirror, and to detect light intensity of the laser beam corresponding to an output voltage that is a difference in potential between the first end surface and the second end surface of the Pockels crystal; a holding and mounting part to hold and to move at least the Pockels crystal; a voltage correction database to store input voltage-output voltage characteristics showing relation between different input voltages and the output voltages of the Pockels crystal when various input voltages are applied to a back side of the mirror; and a calculation unit to identify an input voltage corresponding to a testing output voltage as a surface potential of the electric-field-reduction system based on the input voltage-output voltage characteristics stored in the voltage correction database when the back side of the mirror is disposed with a unit of a surface of the electric-field-reduction system as a test point and when the output voltage of the Pockels crystal that is output as voltage is applied to the stator coil is regarded as the testing output voltage, wherein the Pockels crystal is formed in such a way that a size of a cross section of the Pockels crystal that is perpendicular to an axial direction changes along the axial direction, and the holding and mounting part includes: a protection unit to protect a structure of the Pockels crystal, a movement unit to move the Pockels crystal in order to measure a surface potential of the electric-field-reduction system, and a drive control unit to control the movement unit.

Advantage of the Invention

According to the present invention, it is possible to measure the surface potential of the electric-field-reduction system in which the inverter pulse voltage is supposed to occur, without damaging the soundness of the tapered Pockels crystal.

EMBODIMENTS FOR CARRYING OUT THE INVENTION

Embodiments of a surface potential distribution measuring device according to the present invention will be described with reference to the drawings. Throughout the drawings, same or similar components are denoted by the same reference symbols and will not be described repeatedly.

First Embodiment

Figure 1:
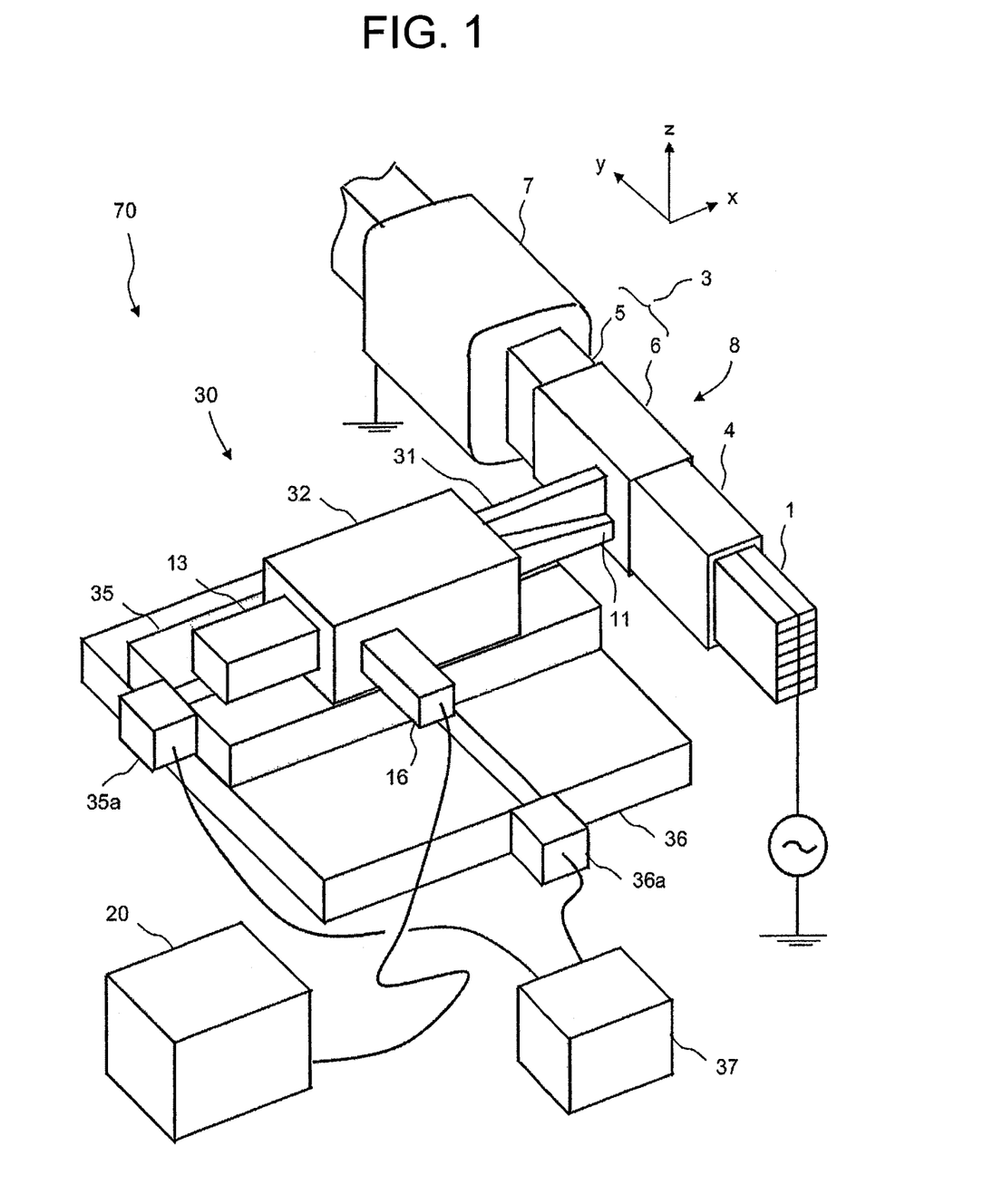
FIG. 1 is a perspective view showing the configuration of a surface-potential distribution measuring device according to a first embodiment.
Figure 2:
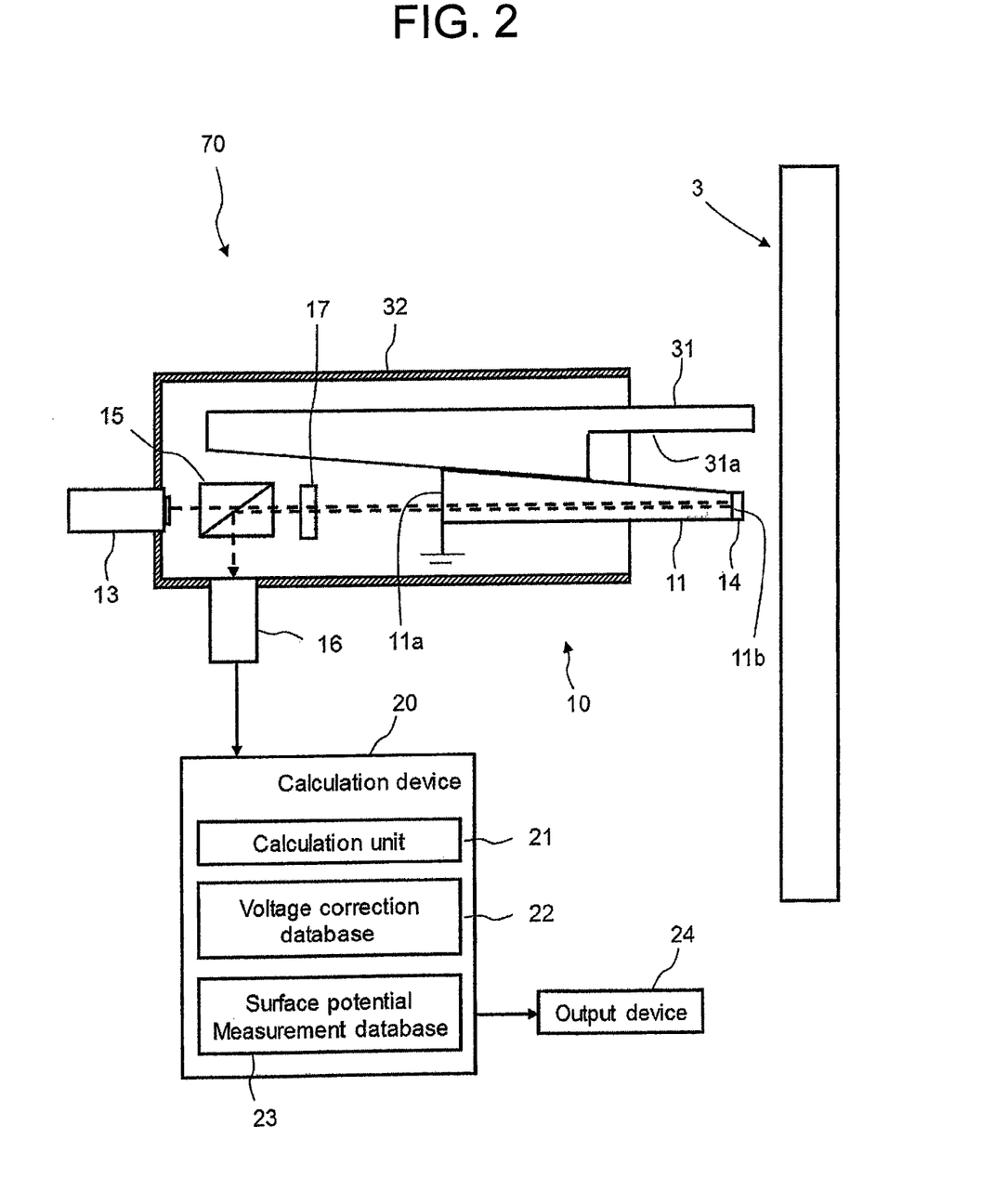
FIG. 2 is a cross sectional view of a longitudinal direction of a body unit that contains Pockels crystal of the surface-potential distribution measuring device according to the first embodiment.

FIG. 1 is a perspective view showing the configuration of a surface-potential distribution measuring device according to a first embodiment. FIG. 2 is a cross sectional view of a longitudinal direction of a body unit that contains Pockels crystal of the surface-potential distribution measuring device according to the first embodiment.

A surface-potential distribution measuring device 70 of the embodiment of the present invention is used for an electric-field-reduction system 3 which is applied to a rotating electric machine. First, the configuration of a rotating electric machine that contains the electric-field-reduction system 3 as a measurement target will be described.

The rotating electric machine includes a stator 2 (Refer to FIG. 8) and a rotor (not shown). The rotor is disposed inside the stator 2 and is rotated around a rotational shaft (not shown). The rotor includes the rotational shaft, a rotor core (not shown), and a rotor coil (not shown). The rotor core rotates together with the rotational shaft. The rotor coil is wound around the rotor core.

The stator 2 includes a stator core 7, a stator coil, and a main insulation layer 4.

The stator core 7 is disposed in such a way as to be a predetermined distance apart from a radial-direction outer side of the rotor. A plurality of slots are formed along an inner peripheral edge of the stator core 7 with a predetermined gaps therebetween in the circumferential direction.

Inside the slots, stator coil conductors 1, or formed coils, are housed. Outside the stator core 7, formed coils are connected via wires. That is, the formed coils are connected together electrically, and a stator coil is produced as a result. The stator coils are produced for U-phase, V-phase, and W-phase. As a result, three-phase winding coils for U-phase, V-phase, and W-phase are produced.

On the outer periphery of the stator coil conductors 1, the main insulation layer 4 is provided to offer insulating coating on the stator coil conductors 1. More specifically, on the outer periphery of the stator coil conductors 1, a ground insulation tape, which is made mainly of mica epoxy, is wound as the main insulation layer 4.

Ends 8 of the stator coils where the main insulation layer 4 are provided (which will be referred to as stator coil ends) are not units that directly contributes to power generation. Therefore, a three-dimensionally bent (or curved) shape is employed for a wire connection unit of the formed coils in the stator coil ends 8. That is, a so-called involute shape is employed. This shape keeps the rotating electric machine compact.

To the stator coil ends 8, an electric-field-reduction system 3 is applied in order to prevent corona discharge, described later, from occurring. The electric-field-reduction system 3 includes a low resistance layer 5 and an electric-field-reduction layer 6.

Between the main insulation layer 4 of the stator coil end 8 and a unit facing a slot wall surface of the stator core 7, partial discharge, or corona discharge, could occur. In order to prevent the partial discharge, on the outer periphery of the main insulation layer 4, the low resistance layer 5 is provided.

More specifically, on the outer periphery of the main insulation layer 4, a low-resistance semiconductive tape is wound as the low resistance layer 5, from a unit where the main insulation layer 4 faces the inner periphery of the stator core 7 to a unit where the main insulation layer 4 exposed to outside the stator core 7. The low resistance layer 5 that is provided outside the stator core 7 is about several tens of millimeters in width.

The low resistance layer 5 is grounded along with the stator core 7. Accordingly, when voltage (AC voltage) is applied to the stator coil conductors 1, the stator coil conductors 1 serve as drive electrode, and the low resistance layer 5 serves as ground electrode. In this case, equipotential lines generated between the stator coil conductors 1 and the low resistance layer 5 inside the stator core 7 are nearly parallel.

The equipotential lines that are generated between the stator coil conductors 1 and the low resistance layer 5 in the stator coil ends 8 are distributed in the thickness direction of the main insulation layer 4. In the stator coil ends 8, depending on a difference in relative permittivity between the main insulation layer 4 and the stator coil conductors 1, and depending on the resistivity of a surface of the stator coil conductors 1, equipotential lines are densely distributed.

As a result, the potential gradient becomes larger on the surface of the stator coil ends 8, and electric fields are concentrated in a direction that goes along the surface of the stator coil end 8. In particular, at an end of the low resistance layer 5, the potential gradient becomes significantly larger, and partial discharge or creeping discharge, which is corona discharge, is likely to occur.

In order to prevent the partial or creeping discharge, at the outer peripheries of the end of the low resistance layer 5 and of the main insulation layer 4 of the stator coil end 8, the electric-field-reduction layer 6 is provided.

More specifically, on the outer periphery of the main insulation layer 4 of the stator coil end 8, a high-resistance semiconductive tape for reducing the potential gradient is wound as the electric-field-reduction layer 6 in such away as to cover the end of the low resistance layer 5.

The surface-potential distribution measuring device 70 measures the surface potential of the electric-field-reduction system 3 that has been applied to the stator coil ends 8. According to the present embodiment, the electric-field-reduction system 3 of a solo stator coil conductor 1 will be described as a measurement target.

The surface-potential distribution measuring device 70 includes a measuring device main body 10 (Refer to FIG. 2), a calculation device 20, and a holding and mounting part 30.

The measuring device main body 10 includes a semiconductor laser generator (which will be referred to as laser light source) 13, a polarization beam splitter (which will be referred to as PBS) 15, Pockels crystal 11, a dielectric mirror (which will be referred to as mirror) 14, a photodetector 16, and a wave length plate 17.

The laser light source 13 emits a laser beam in an incident direction (x-direction) that is perpendicular to a longitudinal direction (y-direction) of the electric-field-reduction system 3. The laser beam has a wavelength of 532.0 nm, a maximum output of 10 mW, and a diameter of 0.34 mm. In this case, the laser beam is 532.0 nm in wavelength. However, the laser beam may have a different wavelength as long as the laser beam can be propagated through the Pockels crystal 11 and optical components without being significantly attenuated.

The laser beam is linearly polarized. The polarization plane of the linearly polarized light is parallel to a direction (z-direction) that is perpendicular to the incident direction (x-direction) and the longitudinal direction (y-direction) of the electric-field-reduction system 3.

The PBS 15 allows only the linearly polarized light to pass therethrough. The PBS 15 allows the laser beam emitted from the laser light source 13 to pass therethrough in the incident direction (x-direction).

The Pockels crystal 11 is disposed in such a way that an axial direction thereof is parallel to the incident direction (x-direction). The Pockels crystal 11 is arranged in the incident direction (x-direction) along with the laser light source 13 and the PBS 15.

Between a first end surface 11a and a second end surface 11b, the Pockels crystal 11 extends in the axial direction (x-direction) from the first end surface 11a to the second end surface 11b. The Pockels crystal 11 is formed in such a way that the size of the cross section (transverse section) perpendicular to the axial direction changes along the axial direction of the Pockels crystal 11. The wave length plate is an element related to phase of cosine function representing the detection light intensity Pout as described later.

According to the present embodiment, cross section, perpendicular to the axial direction, of the Pockels crystal 11 is in a square shape; the sides of the square decrease monotonously in length along the x-direction.

Among the four side surfaces of the Pockels crystal 11 that extend in the axial direction, the facing two side surfaces are planes parallel to the axial direction, and the remaining two surfaces are inclined against the axial direction.

The first end surface 11a of the Pockels crystal 11 is grounded, or the first end surface 11a of the Pockels crystal 11 is set at 0[V] by a power supply device.

The laser beam from the PBS 15 enters the first end surface 11a of the Pockels crystal 11 and then travels toward the second end surface 11b, which does not cross the first end surface 11a of the Pockels crystal 11.

A surface of the mirror 14 is provided at the second end surface 11b of the Pockels crystal 11. Voltage is being applied to the second end surface 11b of the Pockels crystal 11, which is the back side of the mirror 14, as the second end surface 11b of the Pockels crystal 11 is being affected by an electromagnetic field around the electric-field-reduction system 3.

The back side of the mirror 14 is located a predetermined distance apart from a test point or a to-be-tested unit of the electric-field-reduction system 3. The predetermined distance is set based on the degree of asperity of resin of the surface of the electric-field-reduction system 3, spatial resolution, and the like.

The mirror 14 reflects the laser beam, which has entered via the first end surface 11a of the Pockels crystal 11, in a direction opposite to the incident direction (x-direction).

The Pockels crystal 11 is a piezoelectric isotropic crystal belonging to "Crystallographic point group $\bar{4}3m$ or group 23," causing the Pockels effect. The Pockels effect is a phenomenon of birefringence that occurs when an isotropic crystal of a dielectric is placed in an electric field or when voltage is applied thereto.

That is, a change in the refractive index occurs depending on the voltage applied, to change the light intensity. The Pockels crystal 11 may be BGO (e.g., $Bi_{12}GeO_{20}$) crystal or the like.

The Pockels crystal can be sensitive to a component that is parallel to or perpendicular to the propagation direction of light of the external electric field depending on a direction formed by the crystal orientation and the propagation direction of the incident light. The former is referred to as vertical modulation, and the latter is referred to as horizontal modulation.

The Pockels crystal belonging to "Crystallographic point group $\bar{4}3m$ or group 23" is a crystal that can be arranged in a longitudinal-modulation manner. In the case of the vertical-modulation arrangement, a change in the light intensity is proportional to the integral value of the component parallel to an optical path of the external electric field, or to voltage.

The light intensity of the laser beam reflected by the mirror 14 corresponds to output voltage VPout, which is a difference in potential between the first end surface 11a and the second end surface 11b of the Pockels crystal 11.

The PBS 15 allows the laser beam reflected by the mirror 14 to pass therethrough in the longitudinal direction y (According to the present embodiment, the direction is opposite to the longitudinal direction y).

The photodetector 16 has a band to follow high frequency components of the inverter pulse voltage. The photodetector 16 is disposed in the longitudinal direction y with respect to the PBS 15 (According to the present embodiment, the direction is opposite to the longitudinal direction y). The laser beam enters the photodetector 16 from the PBS 15. The photodetector 16 detects detection light intensity Pout as the light intensity of the laser beam.

The detection light intensity Pout corresponds to output voltage VPout, which is a difference in potential between the first end surface 11a and second end surface 11b of the Pockels crystal 11. The detection light intensity Pout is expressed by the following formula as cosine function of the output voltage VPout.

$$Pout = (Pin/2)\{1 - \cos(\pi(V/V\pi) - \theta 0)\}$$

In the above cosine function, Pin is the incident light intensity of the Pockels crystal 11; $V\pi$ is half-wave voltage; $\theta 0$ is a phase difference (arbitrary) given by a wave plate.

According to the present embodiment, based on the detection light intensity Pout, the output voltage VPout of the Pockels crystal 11 is calculated from the inverse function of the above cosine function.

The Pockels crystal 11 is a relatively long crystal that is 100 mm in length, for example. Therefore, the disturbance of the electric field distribution of the dielectric surface is small even as the Pockels crystal 11 is moved closer. As a result, the output voltage VPout of the Pockels crystal 11 is proportional to the surface potential of the electric-field-reduction system 3 to be measured.

The calculation device 20 is a computer that is connected to the photodetector 16 and an output device 24. The calculation device 20 includes a CPU (Central Processing Unit) and a storage device.

In the storage device, computer programs are stored. The CPU reads computer programs from the storage device to execute the computer programs. The output device 24 may be a display device or a printing device.

The calculation device 20 includes, as function blocks of the CPU, a calculation unit 21, a voltage correction database 22, and a surface potential measurement database 23. The calculation device 20 is connected to the output device 24, and outputs calculation results to the output device 24.

The holding and mounting part 30 includes a protection unit 31; a housing 32; an axial direction movement unit 35; an axial direction drive unit 35a, which drives the axial direction movement unit 35; a longitudinal direction movement unit 36; a longitudinal direction drive unit 36a, which drives the longitudinal direction movement unit 36; and a drive control unit 37, which controls the axial direction drive unit 35a and the longitudinal direction drive unit 36a.

The protection unit 31 is provided to protect the Pockels crystal 11. The protection unit 31 has a side surface that is inclined at the same degree as one inclined surface of the Pockels crystal 11 and which is formed in the opposite direction along the axial direction. This side surface of the protection unit 31 is fixed in such a way as to be in close contact with the inclined surface of the Pockels crystal 11.

The position of the protection unit 31 relative to the Pockels crystal 11 is set in such a way that the electric-field-reduction system 3's side tip of the protection unit 31 protrudes more than the second end surface 11b of the Pockels crystal 11 and the mirror 14. Therefore, the tip of the protection unit 31 reaches the electric-field-reduction system 3 earlier than the mirror 14 of the second end surface 11b of the Pockels crystal 11 reaches the electric-field-reduction system 3, thereby preventing the Pockels crystal 11 from making contact with the measurement target or the electric-field-reduction system 3.

In the electric-field-reduction system 3's side tip unit of the protection unit 31, a tip notch 31a is formed. The electric field is disturbed when the dielectric approaches the second end surface 11b of the Pockels crystal 11. Accordingly, the tip notch 31a is formed in order to keep the tip of the protection unit 31 away from the second end surface 11b of the Pockels crystal 11.

The Pockels crystal 11, the PBS 15, and the protection unit 31 are mounted in the housing 32.

The housing 32 is mounted on the axial direction movement unit 35. The axial direction movement unit 35 is driven by the axial direction drive unit 35a and therefore moves back and forth in the axial direction (x-direction).

The axial direction movement unit 35 is mounted on the longitudinal direction movement unit 36. The longitudinal direction movement unit 36 is driven by the longitudinal direction drive unit 36*a* and therefore moves back and forth in the longitudinal direction (y-direction).

The axial direction drive unit 35*a* and the longitudinal direction drive unit 36*a* perform the driving based on instructions issued from the drive control unit 37. The axial direction drive unit 35*a* and the longitudinal direction drive unit 36*a* each output information about the travel direction and distance to the drive control unit 37.

An operation of the surface-potential distribution measuring device 70 of the first embodiment will be described.

The surface-potential distribution measuring device 70 carries out a pre-test voltage correction process, described below. Then, during the test, the surface-potential distribution measuring device 70 carries out a surface potential measurement process, described below. The calculation unit 21 builds the voltage correction database 22 during the voltage correction process, and references the voltage correction database 22 during the surface potential measurement process. In the calculation unit 21, the voltage correction process or the surface potential measurement process is set by a tester's input operation, for example.

Figure 3:
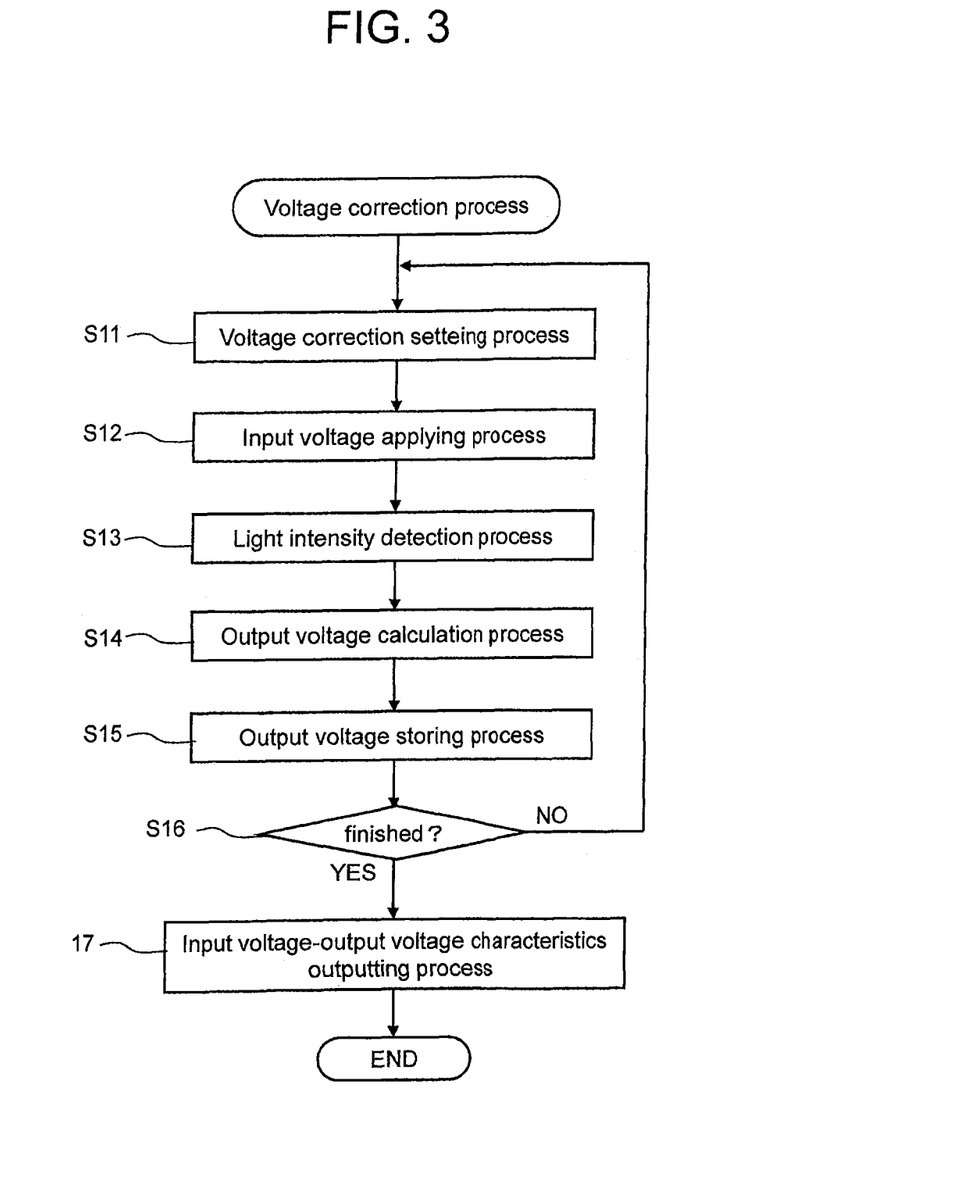
FIG. 3 is a flowchart showing the procedure of the voltage correction process of the surface-potential distribution measuring device according to the first embodiment.

FIG. 3 is a flowchart showing the procedure of the voltage correction process of the surface-potential distribution measuring device according to the first embodiment.

First, in the calculation unit 21, the voltage correction process is set (Step S11: Voltage correction setting process).

Then, to the back side of the mirror 14, which is provided in the end unit of the Pockels crystal 11 of the surface-potential distribution measuring device 70, for example, a 50 Hz AC voltage is applied as input voltage Vin [kV] (Step S12: Input voltage applying process).

At this time, the laser beam emitted from the laser light source 13 passes through the PBS 15 and the Pockels crystal 11 and is reflected by the mirror 14. The laser beam reflected by the mirror 14 then enters the photodetector 16 after passing through the Pockels crystal 11 and the PBS 15. The photodetector 16 detects the light intensity of the laser beam coming from the PBS 15 as the detection light intensity Pout (Step S13: Light intensity detection process).

During the voltage correction process, the calculation unit 21 performs the processes described below.

First, the calculation unit 21 uses the above-described cosine function to calculate the output voltage VPout [V] of the Pockels crystal 11 based on the detection light intensity Pout. That is, the output voltage VPout [V] corresponding to the detection light intensity Pout is calculated from the detection light intensity Pout (Step S14: Output voltage calculation process).

The calculation unit 21 stores, in the voltage correction database 22, the above output voltage VPout [V] together with the above input voltage Vin [kV] that is input through a tester's input operation, for example (Step S15: Output voltage storing process).

Then, if the voltage correction process is not finished (Step S16—NO), the above steps S11 to S15 are repeated with a different input voltage Vin [kV].

As a result, what is stored in the voltage correction database 22 is input voltage-output voltage characteristics showing the relation between different input voltages Vin [kV] and corresponding output voltages VPout [V] of the Pockels crystal 11. Such input voltage-output voltage characteristics are generated, and the voltage correction database 22 is built as a result.

If the voltage correction process is to be finished (Step 316—YES), the calculation unit 21 outputs the input voltage-output voltage characteristics stored in the voltage correction database 22 to the output device 24. If the output device 24 is a display device, the input voltage-output voltage characteristics are displayed on the display device. If the output device 24 is a printing device, the input voltage-output voltage characteristics are printed by the printing device (Step S17: Input voltage-output voltage characteristics outputting process).

Figure 4:
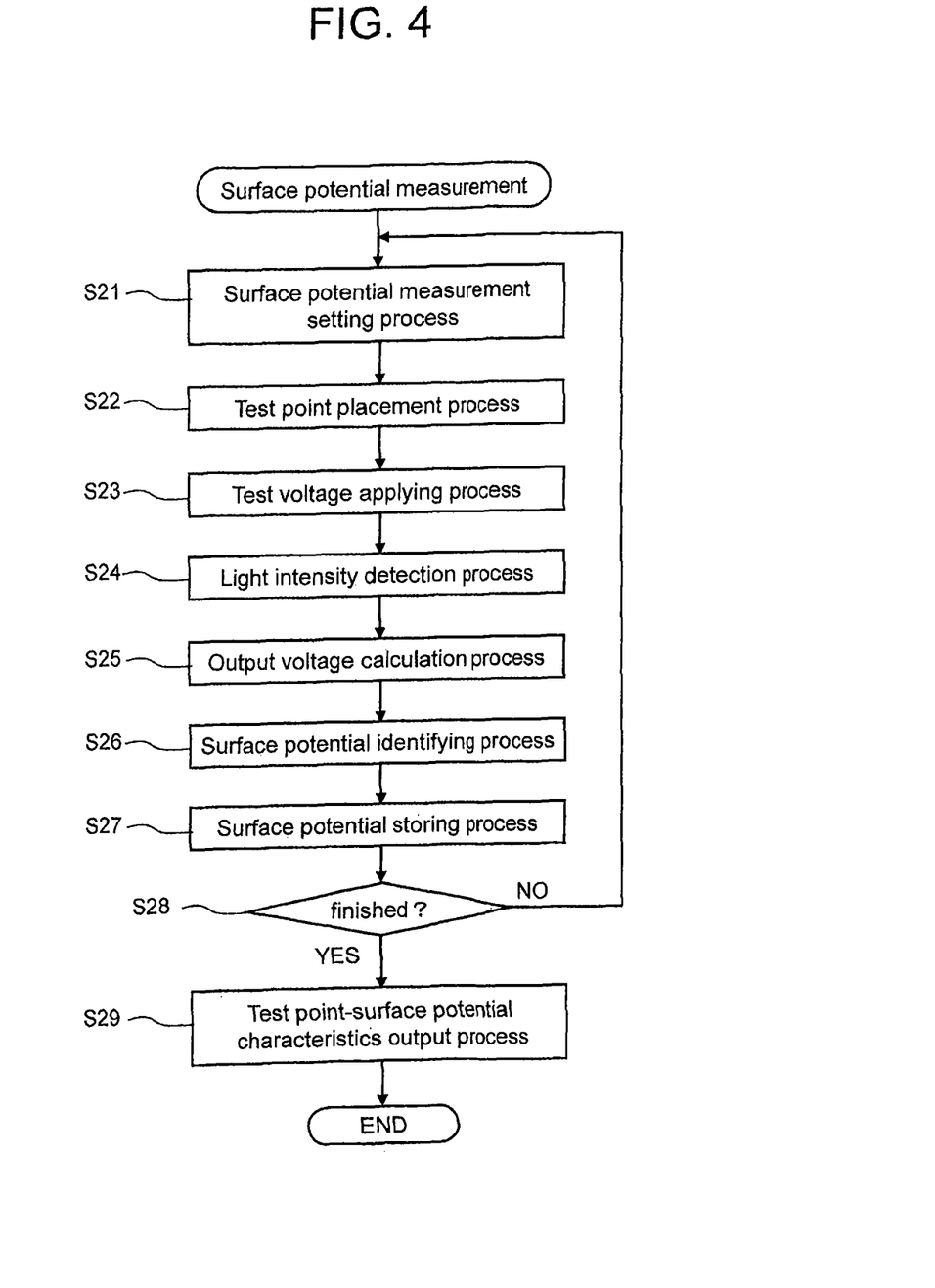
FIG. 4 is a flowchart showing the procedure of the surface potential measurement by the surface-potential distribution measuring device according to the first embodiment.

FIG. 4 is a flowchart showing the procedure of the surface potential measurement by the surface-potential distribution measuring device according to the first embodiment.

First, in the calculation unit 21, the surface potential measurement process is set (Step S21: Surface potential measurement setting process).

Then, in order to sequentially measure the surface of the electric-field-reduction system 3 in both end units of the stator coil ends 8, the position of the Pockels crystal 11 of the surface-potential distribution measuring device 70 is selected, and is controlled by the drive control unit 37 (Step S22: Test point placement process).

More specifically, the drive control unit 37 calculates the distances that the axial direction movement unit 35 and the longitudinal direction movement unit 36 are required to move, and then outputs instructions regarding the to-be-driven distances to the axial direction drive unit 35*a* and the longitudinal direction drive unit 36*a*. As a result, the Pockels crystal 11 is moved to a required position.

At this time, the protection unit 31 moves together with the Pockels crystal 11. Therefore, even if the target position of the Pockels crystal 11 is set in such a way that the Pockels crystal 11 would interfere with the electric-field-reduction system 3, the protection unit 31 is the first component that comes in contact with the electric-field-reduction system 3. Therefore, there will be no burden imposed on the Pockels crystal 11, which therefore is not damaged.

Then, to the stator coil of the rotating electric machine, AC voltage with a frequency of 50 Hz and a crest value of 10 kV is applied as test voltage, for example (Step S23: Test voltage applying process).

During this process, the laser beam emitted from the laser light source 13 passes through the PBS 15 and the Pockels crystal 11 and is reflected by the mirror 14. The laser beam reflected by the mirror 14 then enters the photodetector 16 after passing through the Pockels crystal 11 and the PBS 15. The photodetector 16 detects the light intensity of the laser beam coming from the PBS 15 as the detection light intensity Pout (Step S24: Light intensity detection process).

During the surface potential measurement process, the calculation unit 21 performs the processes described below.

First, the calculation unit 21 uses the above-described cosine function to calculate the output voltage VPout [V] of the Pockels crystal 11 based on the detection light intensity Pout. That is, the output voltage VPout [V] corresponding to the detection light intensity Pout is calculated from the detection light intensity Pout. Here, the output voltage VPout [V] is regarded as testing output voltage Vout [V] (Step S25: Output voltage calculation process).

Based on the input voltage-output voltage characteristics stored in the voltage correction database 22, the calculation unit 21 identifies, as surface potential Vsuf [kV] of the electric-field-reduction system 3, the input voltage Vin [kV] corresponding to the testing output voltage Vout [V] (Step S26: Surface potential identifying process).

For example, the calculation unit 21 stores, in the surface potential measurement database 23, the above-mentioned test position L [mm], which is input via a tester's input operation, and the above surface potential Vsuf [kV] (Step S27: Surface potential storing process).

After that, if the surface potential measurement process is not finished (Step S28—NO), the above steps S21 to S27 are repeated with a different test position L[mm].

If it is judged that the process should be finished (Step S28—YES), the repetition is ended, and a test point-surface potential characteristics output process is carried out (Step S29).

In this manner, when the test point is set at different positions with respect to the back side of the mirror 14, the calculation unit 21 stores, in the surface potential measurement database 23, the different test points and the corresponding surface potentials Vsuf [kV] of the electric-field-reduction system 3 that are identified at that time.

Accordingly, what is stored in the surface potential measurement database 23 is the test point-surface potential characteristics showing the relation between the different test points and the corresponding surface potentials Vsuf [kV] of the electric-field-reduction system 3 that are identified at that time.

As described above, according to the present embodiment, the use of the tapered Pockels crystal 11 makes it possible to suppress the out-of-plane vibration of the side surface of the Pockels crystal 11 when voltage is being applied thereto, and suppress noise associated with the out-of-plane vibration. Therefore, it is possible to accurately measure.

Furthermore, the protection unit 31 for the Pockels crystal 11 is provided. Therefore, it is possible to measure the surface potential of the electric-field-reduction system 3 in which the inverter pulse voltage is supposed to occur, without damaging the soundness of the Pockels crystal 11.

Second Embodiment

Figure 5:
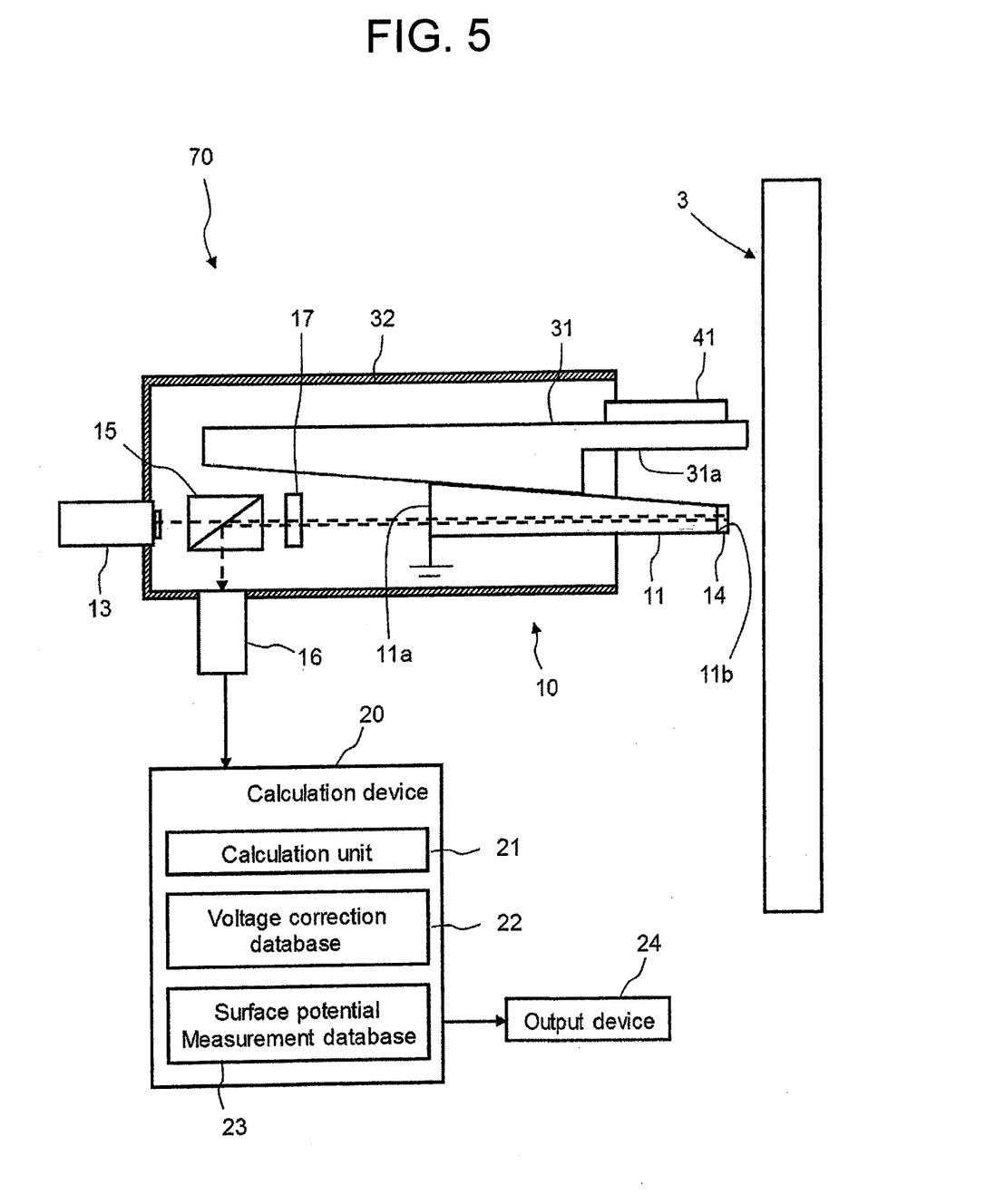
FIG. 5 is a cross sectional view of a longitudinal direction of a body unit containing a Pockels crystal of a surface-potential distribution measuring device according to a second embodiment.

FIG. 5 is a cross sectional view of a longitudinal direction of a body unit containing a Pockels crystal of a surface-potential distribution measuring device according to a second embodiment. The present embodiment is a variant of the first embodiment.

According to the present embodiment, a gap sensor 41 is provided on the protection unit 31. The gap sensor 41 measures the distance between the gap sensor 41 and the electric-field-reduction system 3, which is a measurement target. The gap sensor 41 outputs the distance to the drive control unit 37.

The drive control unit 37 controls the axial direction drive unit 35a so that a gap output from the gap sensor 41 comes to a predetermined target value. The target value is set to a value that would realize a desirable gap size between the Pockels crystal 11 and the electric-field-reduction system 3.

According to the present embodiment described above, in cases where the measurement is carried out along the longitudinal direction of the electric-field-reduction system 3, even if the traveling direction of the longitudinal direction movement unit 36 is not set in such a way as to be parallel to the longitudinal direction of the electric-field-reduction system 3, the axial direction drive unit 35a controls the distance between the Pockels crystal 11 and the electric-field-reduction system 3 in such a way that the gap output from the gap sensor 41 is kept at a constant level.

That is, the Pockels crystal 11 moves parallel to the electric-field-reduction system 3 when moving along the electric-field-reduction system 3.

As a result, during the voltage correction process, there is no need to carry out a broad correction process by turning the distances between the Pockels crystal 11 and the measurement target into parameters. That is, a correction is made for a specific distance, and, at the surface potential measurement step, the gap target value in the gap sensor 41 is set in such a way as to realize the gap at the time of correction. As a result, the measuring accuracy can be ensured.

As described above, according to the present embodiment, it is possible to accurately measure the surface potential of the electric-field-reduction system 3 in which the inverter pulse voltage is supposed to occur, without damaging the soundness of the tapered Pockels crystal 11.

Third Embodiment

Figure 6:
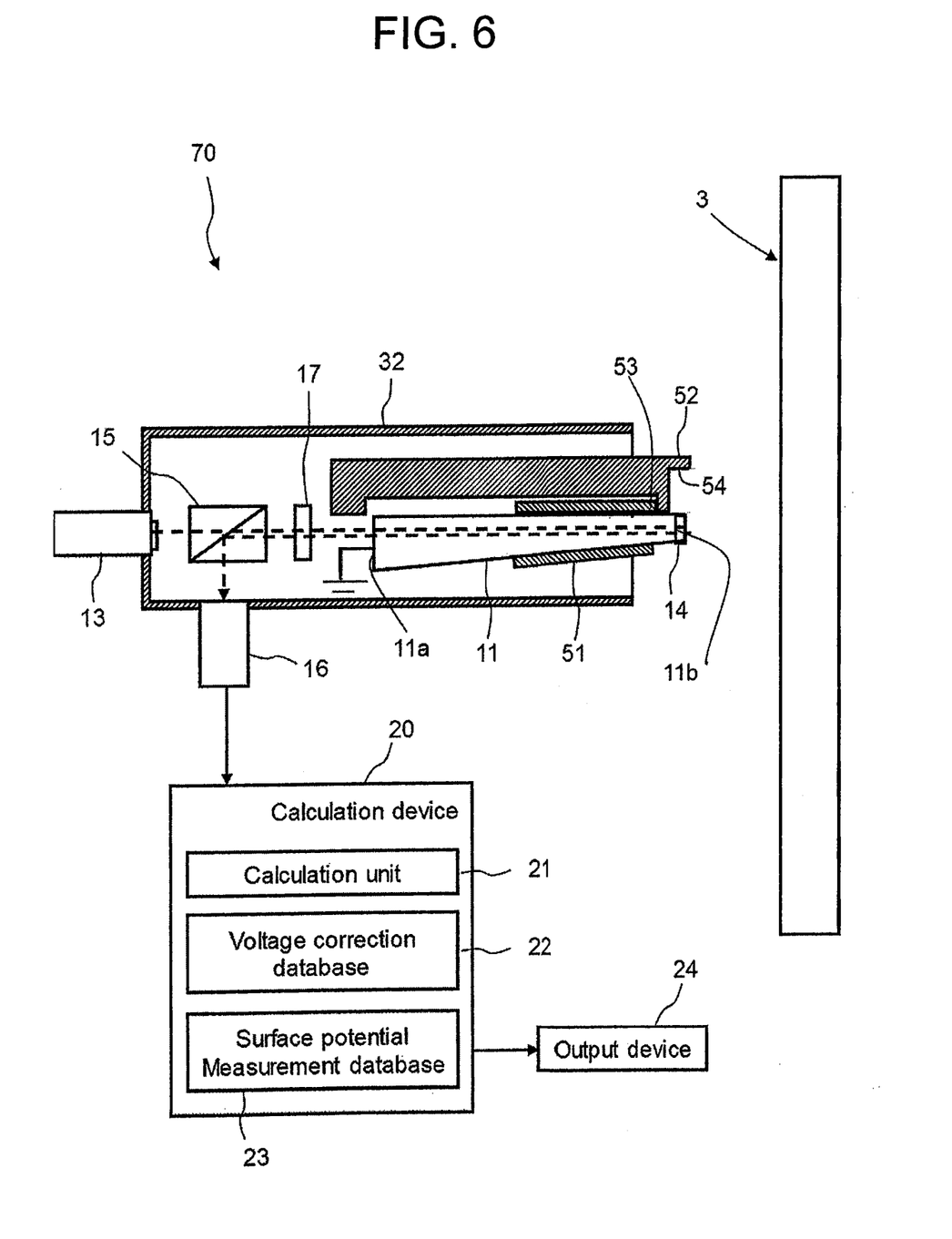
FIG. 6 is a cross sectional view of a longitudinal direction of a body unit containing a Pockels crystal of a surface-potential distribution measuring device according to a third embodiment.

FIG. 6 is a cross sectional view of a longitudinal direction of a body unit containing a Pockels crystal of a surface-potential distribution measuring device according to a third embodiment. The present embodiment is a variant of the first embodiment.

According to the present embodiment, the side surfaces of the Pockels crystal 11 are gripped by a Pockels crystal gripping unit 51. The Pockels crystal gripping unit 51 grips the Pockels crystal 11 with a force that does not cause any significant distortion of the Pockels crystal 11.

The Pockels crystal gripping unit 51 is driven in the axial direction while keep gripping the Pockels crystal 11. The Pockels crystal gripping unit 51 includes a portion that is partially fitted into a movement restriction unit 53, which is a concave unit formed in a protection unit 52.

The portion in which the Pockels crystal gripping unit 51 is fitted into the movement restriction unit 53 is formed in such a way that, even when the Pockels crystal gripping unit 51 has come closest to the electric-field-reduction system 3 after being driven in the axial direction, the second side surface 11b of the Pockels crystal 11 and the mirror 14 do not protrude more than the electric-field-reduction system 3's side end unit of the protection unit 52.

In the tip portion of the side of the electric-field-reduction system 3 of the protection unit 52, a tip notch 54 is formed in such a way as to keep the tip of the protection unit 52 away from the second side surface 11b of the Pockels crystal 11.

According to the present embodiment described above, in cases where measurement is carried out along the longitudinal direction of the electric-field-reduction system 3, even if the target position of the Pockels crystal 11 is set in such a way that the Pockels crystal 11 would interfere with the electric-field-reduction system 3, the Pockels crystal 11 does not hit the electric-field-reduction system 3 and therefore is not damaged because the Pockels crystal 11 is formed in such a way as not to protrude more than the protection unit 52.

As described above, according to the present embodiment, it is possible to accurately measure the surface potential of the electric-field-reduction system 3 in which the inverter pulse voltage is supposed to occur, without damaging the soundness of the tapered Pockels crystal 11.

Fourth Embodiment

Figure 7:
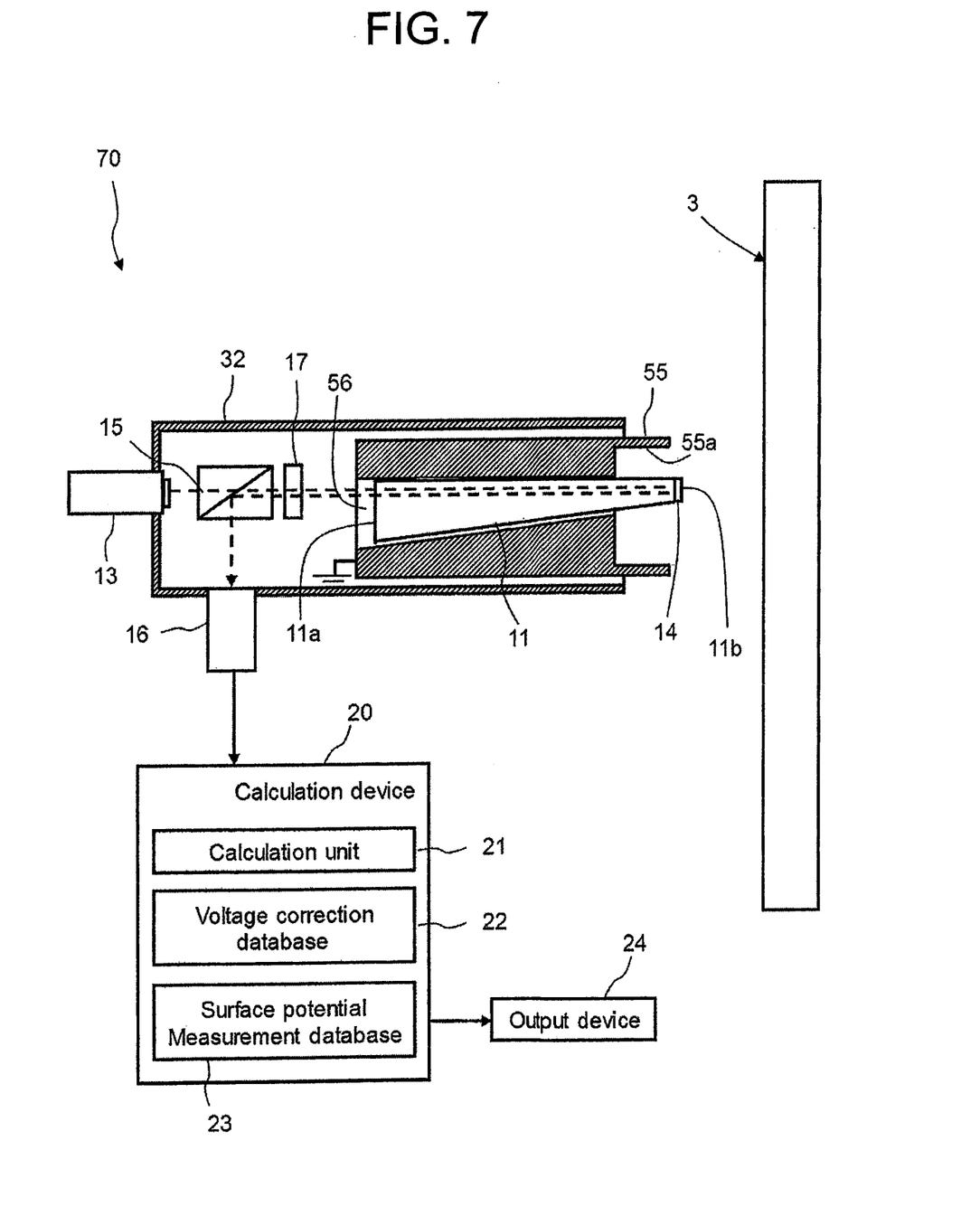
FIG. 7 is a cross sectional view of a longitudinal direction of a body unit containing a Pockels crystal of a surface-potential distribution measuring device according to a fourth embodiment.

FIG. 7 is a cross sectional view of a longitudinal direction of a body unit containing a Pockels crystal of a surface-potential distribution measuring device according to a fourth embodiment. The present embodiment is a variant of the third embodiment.

In a protection unit 55, a guide hole 56 is formed in such a way as to allow the Pockels crystal 11 to move. The guide hole 56 passes through the Pockels crystal 11 in the longitudinal direction thereof. The guide hole 56 is formed in such a way as to become smaller in area, from the side corresponding to the first side surface 11a of the Pockels crystal 11 toward the side corresponding to the second side surface 11b. The area of the guide hole 56 is set to a size that stops and thereby prevents the Pockels crystal 11 from protruding out of the protection unit 55. The structure is not limited to the one that prevents the Pockels crystal 11 from protruding. Even if the Pockels crystal 11 protrudes, the length of the protruding unit may be limited.

In order to keep a load from being locally applied to the Pockels crystal 11 at a time when the movement of the Pockels crystal 11 is being restricted, it is desirable that each of the four inner side surfaces of the guide hole 56 be formed and inclined at the same angles as the corresponding one of the four side surfaces of the Pockels crystal 11.

The Pockels crystal 11 is moved in such a way that the side surface of the non-tapered side of the Pockels crystal 11 moves along the inner side surface of the guide hole 56 that faces this side surface.

In the tip portion of the side of electric-field-reduction system 3 of the protection unit 55, a tip notch 55a is formed in order to keep the tip of the protection unit 55 away from the second end surface 11b of the Pockels crystal 11. The length of a cylindrical unit (periphery of the tip notch 55a) of the tip of the protection unit 55 in which the tip notch 55a is formed is so formed that, even if the Pockels crystal 11 protrudes to such a degree that the Pockels crystal 11 comes closest to the electric-field-reduction system 3, the tip of the cylindrical unit is closer to the electric-field-reduction system 3 than the Pockels crystal 11 is.

Even if there is no cylindrical unit and the Pockels crystal 11 protrudes toward the electric-field-reduction system 3 more than the protection unit 55, the necessary distance between the Pockels crystal 11 and the electric-field-reduction system 3 may be ensured by means of a gap sensor or the like to prevent the Pockels crystal 11 from hitting the electric-field-reduction system 3. If such a distance can be ensured, the cylindrical unit can be omitted.

According to the present embodiment described above, it is possible to protect the Pockels crystal 11 by making use of the tapered unit formed in the Pockels crystal 11, without adding a special unit such as the Pockels crystal gripping unit 51 of the third embodiment. That is, even if the target position of the Pockels crystal 11 is set in such a way that the Pockels crystal 11 would interfere with the electric-field-reduction system 3, the guide hole 56 becomes gradually narrower as the Pockels crystal 11 approaches the electric-field-reduction system 3, and the Pockels crystal 11 therefore stops in the middle of the guide hole 56. According to such a movement restriction structure, the Pockels crystal 11 stops short of the end surface of the protection unit 52, or does not protrude extremely from the protection unit 52. As a result, the Pockels crystal 11 does not hit the electric-field-reduction system 3 and is therefore not damaged.

As described above, according to the present embodiment, it is possible to accurately measure the surface potential of the electric-field-reduction system 3 in which the inverter pulse voltage is supposed to occur, without damaging the soundness of the tapered Pockels crystal 11.

Fifth Embodiment

Figure 8:
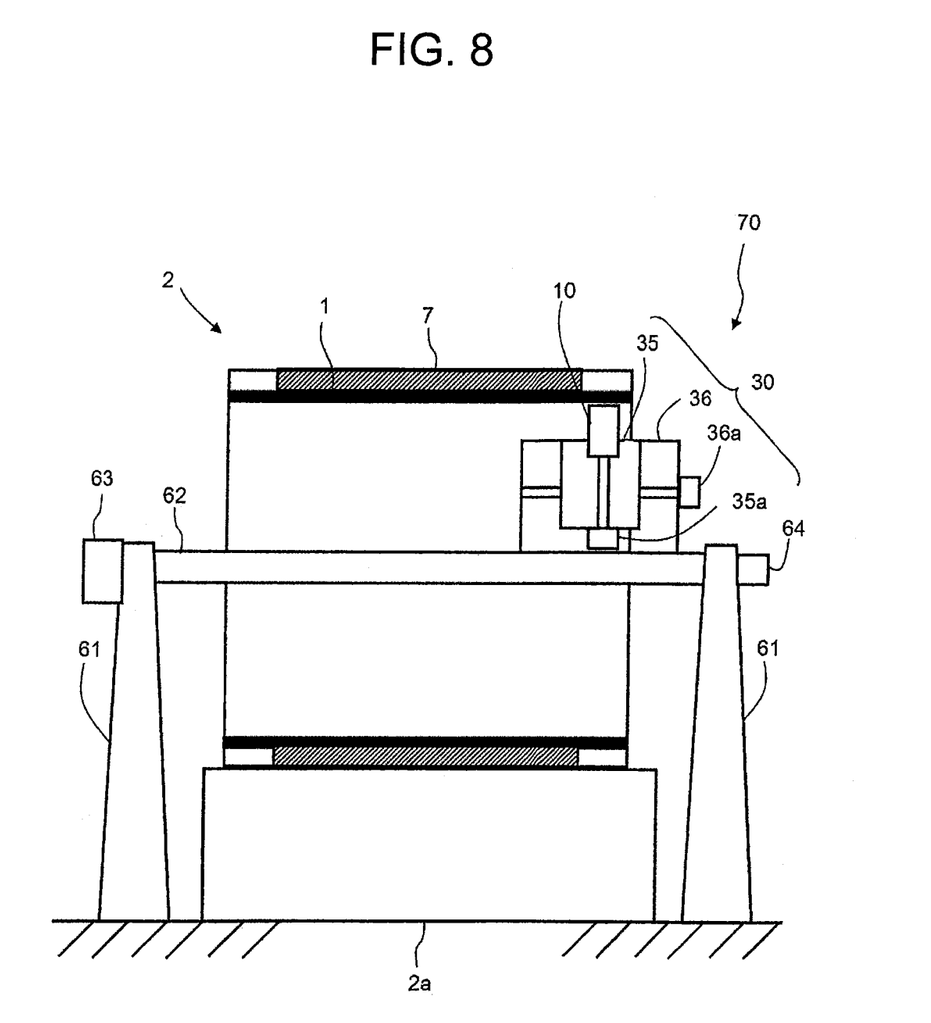
FIG. 8 is a sectional elevational view of a stator that contains the configuration of a surface-potential distribution measuring device according to a fifth embodiment.

FIG. 8 is a sectional elevational view of a stator that contains the configuration of a surface-potential distribution measuring device according to a fifth embodiment.

The present embodiment is a variant of the first embodiment. The present embodiment shows not only the case where a single stator coil conductor 1 is tested but also the case where measurement is carried out at a time when stator coil conductors 1 are placed in each slot of the stator 2 and are connected via wires.

The stator 2 includes a stator core 7 and a stator coil and is in a cylindrical shape. Along an inner peripheral surface of the stator core 7, a plurality of slots are formed at predetermined intervals in the circumferential direction in such a way as to extend in the axial direction.

In each slot, a formed coil, which is a stator coil conductor 1, is housed. Outside the stator core 7, the formed coils are connected together via wires. The stator 2 is mounted on a stator assembly stand 2a.

A rotor, which is not shown, is not placed in the stator 2. Therefore, the stator 2 is hollow.

A surface-potential distribution measuring device 70 of the present embodiment measures a surface potential distribution of an electric-field-reduction system 3 when voltage is applied to the stator coil conductors 1 in this state.

The surface-potential distribution measuring device 70 of the present embodiment includes a measuring device main body 10, a calculation device 20, and a holding and mounting part 30, and further includes support bases 61, a support shaft 62, and a rotation drive unit 63. The calculation device 20 and a drive control unit 37 are not shown in the diagram.

The support shaft 62 is placed in such a way as to pass through the space inside the stator 2, with both ends of the support shaft 62 being supported by the support bases 61. The support shaft 62 is driven and rotated by the rotation drive unit 63.

The support shaft 62 supports the holding and mounting part 30. That is, the support shaft 62 supports a longitudinal direction movement unit 36 to which a longitudinal direction drive unit 36a is attached. The longitudinal direction movement unit 36 supports an axial direction movement unit 35 to which an axial direction drive unit 35a is attached. The axial direction movement unit 35 supports the measuring device main body 10.

The holding and mounting part 30 is supported by the support shaft 62 and driven by the axial direction drive unit 64 so that the holding and mounting part 30 can move along the axial direction of the support shaft 62. In the case of the present embodiment, the holding and mounting part 30 can move. However, the present invention is not limited to the holding and mounting part 30 that can move. For example, the holding and mounting part 30 may be attached to axial direction positions of the support shaft 62 corresponding to both-side stator end units in such a way as to be able to be detached therefrom.

According to the present embodiment having the above configuration, the holding and mounting part 30 is attached to positions on the support shaft 62 that correspond to both-side stator end units. Accordingly, the holding and mounting part 30 can be moved closer to the entire circumference of the stator inner surface.

As for the measuring device main body 10 that is attached to the holding and mounting part 30, the movement of the holding and mounting part 30 enables the tip of the Pockels crystal 11 to carry out measurement at each position while keeping an appropriate distance from the electric-field-reduction system 3.

As described above, according to the present embodiment, it is possible to accurately measure the surface potential of the electric-field-reduction system 3 in which the inverter pulse voltage is supposed to occur, without damaging the soundness of the tapered Pockels crystal 11, even when being incorporated in the stator.

Other Embodiment

Although the preferred embodiments of the present invention have been described above, the embodiments are merely illustrative and do not limit the scope of the present invention.

For example, what has been described is the case where the shape of the Pockels crystal is square in cross section, and the length of the sides decrease monotonously in the axial direction. However, the present invention is not limited to this. For example, the shape of the Pockels crystal may be rectangular or polygonal in cross section. The length of the sides should decrease in the axial direction monotonously.

Features of each of the embodiments may be used in combination. For example, the gap measurement by the gap sensor 41 of the second embodiment, and the fitting structure involving the movement restriction unit 53 and Pockels crystal gripping unit 51 of the third embodiment may be used in combination. The gap measurement by the gap sensor 41 of the second embodiment, and the movement restriction structure involving the guide hole 56 of the protection unit 55 of the fourth embodiment may be used in combination.

Furthermore, these features may be used in combination with the application form of the stator 2 in the assembled state of the stator 2 of the fifth embodiment.

These embodiments can be practiced in other various forms, and various omissions, substitutions and changes may be made without departing from the scope of the invention.

The embodiments and modifications thereof are included in the scope or spirit of the present invention and in the appended claims and their equivalents.

EXPLANATION OF REFERENCE SYMBOLS

1: stator coil conductors, 2: stator, 2a: stator assembly stand, 3: electric-field-reduction system, 4: main insulation layer, 5: low resistance layer, 6: electric-field-reduction layer, 7: stator core, 8: stator coil end, 10: measuring device main body, 11: Pockels crystal, 11a: first end surface, 11b: second end surface, 13: laser light source, 14: mirror, 15: PBS (laser polarization beam splitter), 16: photodetector, 17: wave length plate, 20: calculation device, 21: calculation unit, 22: voltage correction database, 23: surface potential measurement database, 24: output device, 30: holding and mounting part, 31: protection unit, 31a: tip notch, 32: housing, 35: axial direction movement unit, 35a: axial direction drive unit (movement unit), 36: longitudinal direction movement unit (movement unit), 36a: longitudinal direction drive unit, 37: drive control unit, 41: gap sensor, 51: Pockels crystal gripping unit, 52: protection unit, 53: movement restriction unit, 54: tip notch, 55: protection unit, 55a: tip notch, 56: guide hole, 61: support base, 62: support shaft, 63: rotation drive unit, 64: axial direction drive unit, 70: surface-potential distribution measuring device

The invention claimed is:

1. A surface-potential distribution measuring device for measuring a surface potential of an electric-field-reduction system that is applied along a longitudinal direction of a stator coil end which is a stator coil end unit of a stator of a rotating electric machine, the device comprising:
    a laser light source to emit a laser beam;
    a Pockels crystal to receive the laser beam emitted from the laser light source via a first end surface of the Pockels crystal in an incident direction;
    a mirror whose surface is provided at a second end surface that is the opposite side of the Pockels crystal from the first end surface and which reflects the laser beam that enters the Pockels crystal via the first end surface in a direction opposite to the incident direction;
    a photodetector having a band to follow a high frequency component of an inverter pulse voltage, a photodetector to receive the laser beam reflected by the mirror, and to detect light intensity of the laser beam corresponding to an output voltage that is a difference in potential between the first end surface and the second end surface of the Pockels crystal;
    a holding and mounting part to hold and to move at least the Pockels crystal;
    a voltage correction database to store input voltage-output voltage characteristics showing relation between different input voltages and the output voltages of the Pockels crystal when various input voltages are applied to a back side of the mirror; and
    a calculation unit to identify an input voltage corresponding to a testing output voltage as a surface potential of the electric-field-reduction system based on the input voltage-output voltage characteristics stored in the voltage correction database when the back side of the mirror is disposed with a unit of a surface of the electric-field-reduction system as a test point and when the output voltage of the Pockels crystal that is output as voltage is applied to the stator coil is regarded as the testing output voltage, wherein
    the Pockels crystal is formed in such a way that a size of a cross section of the Pockels crystal that is perpendicular to an axial direction changes along the axial direction, and
    the holding and mounting part includes:
        a protection unit to protect a structure of the Pockels crystal,
        a movement unit to move the Pockels crystal in order to measure a surface potential of the electric-field-reduction system, and
        a drive control unit to control the movement unit.

2. The surface-potential distribution measuring device according to claim 1, wherein
    a tip of the axial direction of the protection unit protrudes in the axial direction from the second end surface of the Pockels crystal.

3. The surface-potential distribution measuring device according to claim 1, wherein:
    the holding and mounting part includes:
        a longitudinal-direction movement unit to move the Pockels crystal and the protection unit in a longitudinal direction of the electric-field-reduction system; and
        an axial direction movement unit to move the Pockels crystal and the protection unit in the axial direction; and
    the drive control unit outputs a movement command to the longitudinal-direction movement unit and the axial direction movement unit.

4. The surface-potential distribution measuring device according to claim 1, wherein
    the Pockels crystal and the protection unit move together.

5. The surface-potential distribution measuring device according to claim 1, wherein:
    the holding and mounting part includes a Pockels crystal gripping unit that moves together with the Pockels crystal by gripping the Pockels crystal;

the Pockels crystal gripping unit moves along the protection unit; and a movement restriction unit is formed in the protection unit, in such a way as to restrict movement of the Pockels crystal gripping unit in order to limit a projection of the second end unit of the Pockels crystal from the protection unit.

6. The surface-potential distribution measuring device according to claim 1, wherein:

the Pockels crystal is formed in such a way as to become gradually thinner from the first end surface toward the second end surface;

a guide hole is formed in the protection unit, in such a way as to pass therethrough in a movement direction of the Pockels crystal so that the Pockels crystal can move; and the guide hole is formed in such a way as to become gradually narrower toward the electric-field-reduction system in order to limit a projection of the second end unit of the Pockels crystal from the protection unit.

7. The surface-potential distribution measuring device according to claim 1, wherein the holding and mounting part further includes a gap sensor that measures a gap between the Pockels crystal and the electric-field-reduction system and outputs a gap signal to the drive control unit.

8. The surface-potential distribution measuring device according to claim 1, further comprising:

a rotatable support shaft to support the holding and mounting part, the support shaft extending along a center of an axis of the stator;

a rotation drive unit to rotate the support shaft; and a support base to support the support shaft.

9. The surface-potential distribution measuring device according to claim 1, further comprising a polarization beam splitter to allow only linearly polarized light to pass therethrough, wherein the laser light source emits the laser beam that is the linearly polarized light, in the incident direction into the electric-field-reduction system, the polarization beam splitter allows the laser beam emitted from the laser light source to pass therethrough in the incident direction, the Pockels crystal is disposed in such a way that an axial direction thereof is parallel to the incident direction, and is arranged in the incident direction side by side with the laser light source and the polarization beam splitter, and allows the laser beam from the polarization beam splitter to enter the first end surface, and the polarization beam splitter allows the laser beam reflected by the mirror to pass therethrough in a direction perpendicular to the axial direction.

10. The surface-potential distribution measuring device according to claim 1, wherein the first end surface of the Pockels crystal is grounded.

11. The surface-potential distribution measuring device according to claim 1, wherein the Pockels crystal is a BGO crystal.

* * * * *